(12) United States Patent
Yu et al.

(10) Patent No.: US 9,229,327 B2
(45) Date of Patent: Jan. 5, 2016

(54) ELECTRON BEAM EXPOSURE APPARATUS AND METHOD OF DETECTING ERROR USING THE SAME

(71) Applicant: SAMSUNG ELECTRONICS CO., LTD., Suwon-si, Gyeonggi-do (KR)

(72) Inventors: Sang Yong Yu, Hwaseong-si (KR); Sang Hee Lee, Seongnam-si (KR); Seong Yong Moon, Yongin-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/446,736

(22) Filed: Jul. 30, 2014

(65) Prior Publication Data

US 2015/0102236 A1    Apr. 16, 2015

(30) Foreign Application Priority Data

Oct. 10, 2013  (KR) .......................... 10-2013-0120901

(51) Int. Cl.
  *H01J 37/244* (2006.01)
  *G03F 7/20* (2006.01)
  *H01J 37/304* (2006.01)
  *H01J 37/317* (2006.01)

(52) U.S. Cl.
  CPC .................. *G03F 7/20* (2013.01); *H01J 37/244* (2013.01); *H01J 37/304* (2013.01); *H01J 37/3174* (2013.01); *H01J 2237/24514* (2013.01); *H01J 2237/24542* (2013.01); *H01J 2237/24564* (2013.01); *H01J 2237/30433* (2013.01); *H01J 2237/30455* (2013.01); *H01J 2237/31774* (2013.01); *H01J 2237/31776* (2013.01); *H01J 2237/31798* (2013.01)

(58) Field of Classification Search
  USPC ............................................... 250/492.1, 397
  See application file for complete search history.

(56) References Cited

U.S. PATENT DOCUMENTS

| | | | |
|---|---|---|---|
| 5,523,576 A | 6/1996 | Koike et al. | |
| 5,650,629 A * | 7/1997 | Levi | ........................ 250/491.1 |
| 7,456,414 B2 * | 11/2008 | Mirro et al. | ................ 250/491.1 |
| 8,274,047 B2 | 9/2012 | Naito et al. | |

FOREIGN PATENT DOCUMENTS

| | | |
|---|---|---|
| JP | 4307470 B2 | 5/2009 |
| KR | 10-2006-0000550 A | 1/2006 |
| KR | 10-0576441 B1 | 4/2006 |
| KR | 10-2006-0122192 A | 11/2006 |
| KR | 10-2007-0062079 A | 6/2007 |
| KR | 10-0755413 B1 | 8/2007 |
| KR | 10-0807957 B1 | 2/2008 |
| KR | 10-0875569 B1 | 12/2008 |
| KR | 10-0898848 B1 | 5/2009 |
| KR | 10-2009-0099414 A | 9/2009 |
| KR | 10-2010-0094143 A | 8/2010 |

(Continued)

*Primary Examiner* — Kiet T Nguyen
(74) *Attorney, Agent, or Firm* — Lee & Morse, P.C.

(57) ABSTRACT

An electron beam exposure apparatus includes an electron beam source, a stage, and an error detection device. The electron beam source radiates a first electron beam corresponding to first input data and a second electron beam corresponding to second input data. The stage includes a mask on which the first electron beam is radiated. The stage may be configured to move the mask. The error detection device detects an error of the second electron beam and outputs error detection information.

10 Claims, 9 Drawing Sheets

(56) References Cited

FOREIGN PATENT DOCUMENTS

| KR | 10-0977095 | B1 | 8/2010 |
| KR | 10-0982135 | B1 | 9/2010 |
| KR | 10-2011-0021646 | A | 3/2011 |
| KR | 10-2013-0044385 | A | 5/2013 |
| KR | 10-2013-0055023 | A | 5/2013 |

* cited by examiner

ELECTRON BEAM EXPOSURE APPARATUS AND METHOD OF DETECTING ERROR USING THE SAME

CROSS-REFERENCE TO RELATED APPLICATION

Korean Patent Application No. 10-2013-0120901, filed on Oct. 10, 2013, and entitled, "Electron Beam Exposure Apparatus and Method of Detecting Error Using the Same," is incorporated by reference herein in its entirety.

BACKGROUND

1. Field

One or more embodiments herein relate to beam scanning for errors.

2. Description of the Related Art

Fabrication of semiconductor integrated circuits usually includes a process of exposing a circuit pattern on a mask using an electron beam exposure apparatus. During exposure, various errors (e.g., position or size errors) may occur with respect to the electron beam. These errors may be caused by stage shift or mask sliding. Attempts have been made to address these errors. According to one technique, the circuit pattern is exposed to a blank mask, a process is performed, and then measurement is taken in an attempt to detect an error of the electron beam. This technique is costly and time consuming.

SUMMARY

In accordance with one embodiment, an electron beam exposure apparatus includes an electron beam source configured to radiate a first electron beam corresponding to first input data and a second electron beam corresponding to second input data; a stage including a mask on which the first electron beam is radiated, the stage configured to move the mask; and an error detection device configured to detect an error of the second electron beam and to output error detection information.

The error detection device may include a sensor including a first line and a second line, wherein the sensor is to receive the second electron beam radiated on the first and second lines and to detect a first signal from the first line and a second signal from the second line; and a data processor configured to output the error detection information based on a result of comparing the first signal with the second signal.

The sensor may include nonconductors on a first conductor and spaced by a predetermined gap, and second conductors on respective nonconductors, wherein one of the nonconductors and one of the second conductors at one side of the predetermined gap form the first line and wherein another one of the nonconductors and another one of the second conductors at another side of the predetermined gap form the second line. The second electron beam may have a width greater than the predetermined gap.

The data processor may include a comparator configured to compare the first signal with the second signal, and to output a difference value between the first and second signals according to a result of the comparison; and a determiner configured to determine whether the difference value is within a predetermined first reference range, the determiner to output the error detection information based on a result of the determination.

The determiner may include a counter configured to count the number of electron beams with an error based on the determination result.

The error detection device may include an amplifier configured to detect energy of the second electron beam based on an amount of current detected from a lower part of the first conductor, wherein the determiner is configured to determine whether the energy is within a predetermined second reference range and outputs error detection information based on a result of the determination based on the second reference range.

A plurality of second electron beams may be radiated by the electron beam source based on the second input data at predetermined intervals, left and right sides of second electron beams in a first group may be radiated on the first and second lines, and upper and lower sides of second electron beams in a second group may be radiated on the first and second lines.

The error detection information may include beam size information, beam position information, and a number of electron beams with an error. The error detection device may be attached to the stage on which the mask is formed, separated from the mask, or detachably formed on a top of the mask in a same size as the mask.

In accordance with another embodiment, a method of detecting an error includes radiating an electron beam on a first line and a second line of a sensor based on input data; detecting a first signal and a second signal output from the first line and the second line based on the electron beam; and determining whether a difference value between the first signal and the second signal is within a predetermined reference range.

Determining the difference value may include determining that an error has been detected in the electron beam when the difference value is outside the predetermined reference range, and outputting error detection information corresponding to the electron beam in which the error has been detected. The error detection information may include beam size information, beam position information, and a number of electron beams in which an error has been detected.

In accordance with another embodiment, a computer-readable recording medium for recording a computer program, the computer program including first code to radiate an electron beam on a first line and a second line of a sensor based on input data; second code to detect a first signal and a second signal output from the first line and the second line based on the electron beam; and third code to determine whether a difference value between the first signal and the second signal is within a predetermined reference range.

In accordance with another embodiment, an error detector includes a sensor including a first line spaced from a second line; and a data processor to generate error detection information, wherein the first line is to output a first signal based on an electron beam and the second line is to output a second signal based on the electron beam, and wherein the data processor is to generate the error detection information based on a comparison of the first and second signals.

The data processor may include a comparator to compare the first signal with the second signal, and to generate a difference value between the first and second signals according to a result of the comparison; and a determiner to determine whether the difference value is within a predetermined first reference range, the determiner to output the error detection information based on a result of the determination. The determiner may include a counter to count a number of electron beams with an error based on the determination result.

The error detection device may include an amplifier to detect energy of the electron beam based on an amount of current detected from a lower part of a conductor of the sensor, wherein the determiner is to determine whether the energy is within a predetermined second reference range and outputs error detection information based on a result of the determination based on the second reference range.

The sensor may include nonconductors on a first conductor and spaced by a predetermined gap, and second conductors on respective ones of the nonconductors, wherein one of the nonconductors and one of the second conductors at one side of the predetermined gap are included in the first line and wherein another one of the nonconductors and another one of the second conductors at another side of the predetermined gap are included in the second line. The electron beam may have a width greater than the predetermined gap.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 1A:
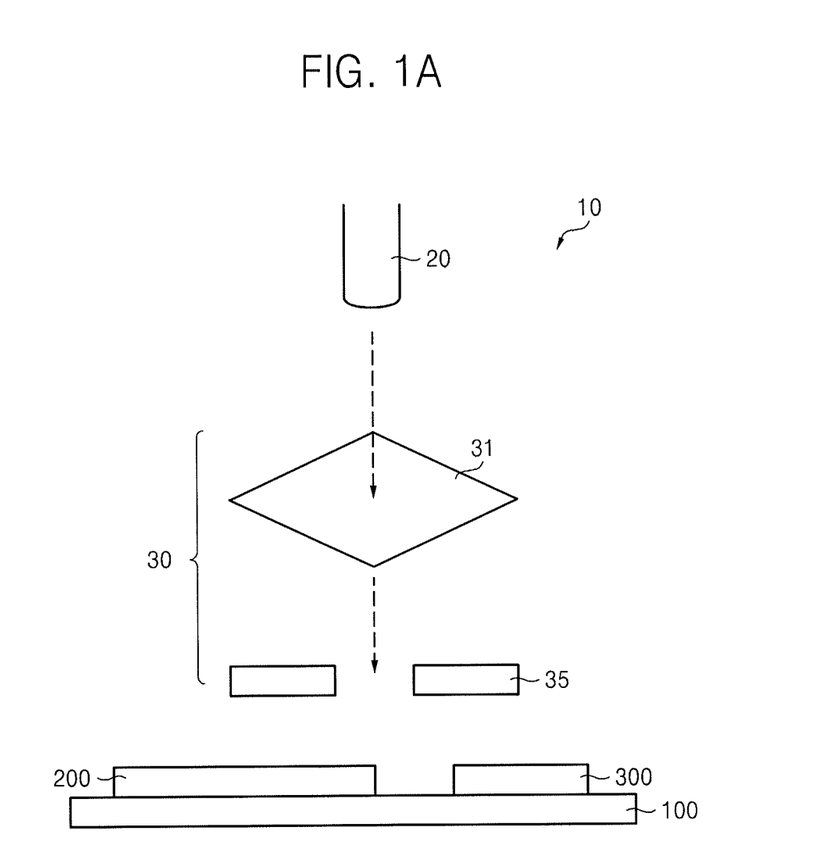
FIG. 1A illustrates an embodiment of an electron beam exposure apparatus in which a mask and error detection device are on a substrate.

FIG. 1A illustrates an embodiment of an electron beam exposure apparatus 10 which includes an electron gun 20, an electron beam source 30, a stage 100, a mask 200, and an error detection device 300.

The electron gun 20 irradiates an electron beam having a predetermined cross-sectional area. The electron gun 20 may repeatedly irradiate electron beams at predetermined intervals.

The electron beam source 30 includes an aperture 31 and a deflector 35 to control the size and direction of the electron beam. The electron beam source 30 may also include a lens and a reflector. The aperture 31 may create the shape of the electron beam and control the size of the electron beam by transmitting only part of the electron beam. The deflector 35 may control the direction of movement of the electron beam.

The stage 100 supports mask 200 and moves in X-, Y- and Z-axis directions. The mask 200 may be a quartz glass substrate with a circuit pattern on its surface.

The error detection device 300 is provided on stage 100, on which mask 200 has been placed. The error detection device 300 detects an error of electron beams irradiated from electron gun 20 through electron beam source 30.

The electron beam source 30 controls electron beams irradiated from electron gun 20, to provide an electron beam corresponding to first input data and an electron beam corresponding to second input data. The first input data may correspond to a circuit pattern exposed on mask 200. The second input data may correspond to an electron beam radiated on error detection device 300, to allow for detection of an error of the electron beam.

Figure 1B:
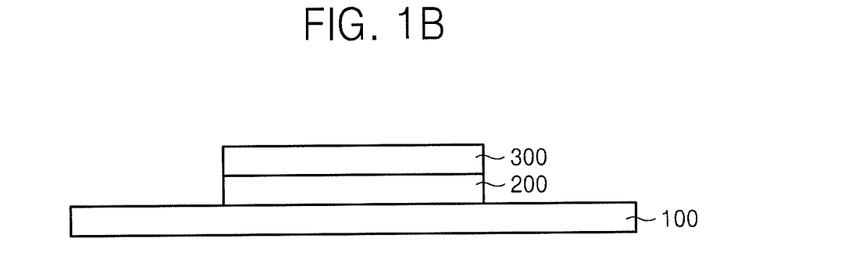
FIG. 1B illustrates an embodiment in which an error detection device overlaps a mask on a substrate.
Figure 2:
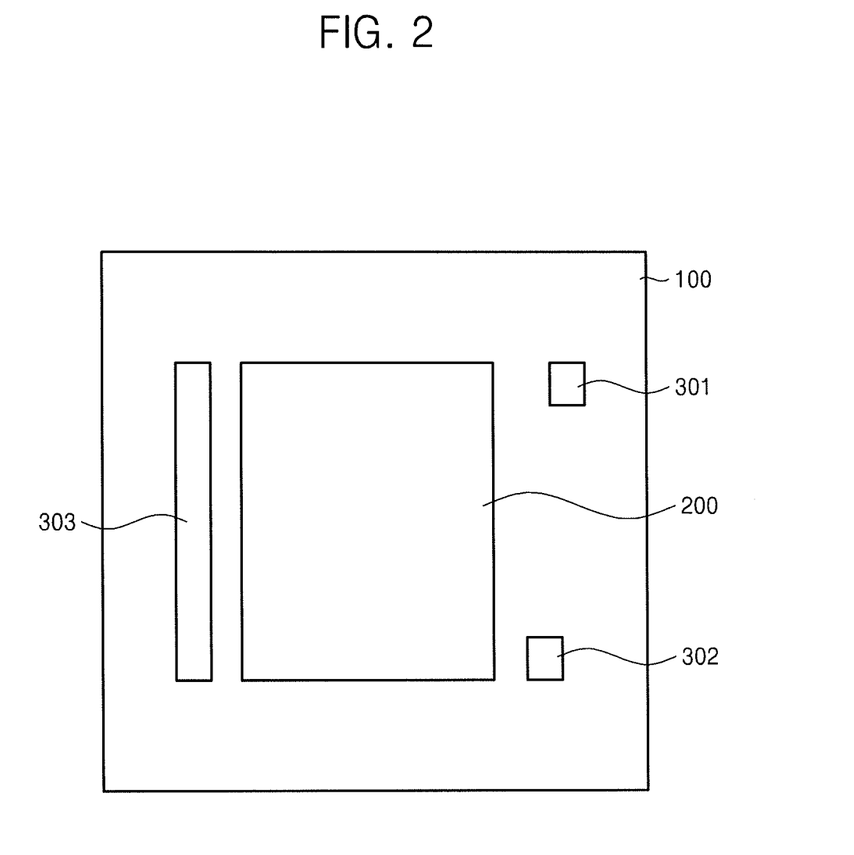
FIG. 2 illustrates a top view of a stage in FIG. 1.

FIG. 2 illustrates a top view of stage 100 in FIG. 1. Referring to FIG. 2, error detection devices 301, 302, and 303 may be implemented in various forms, and one or more error detection devices 301 through 303 may be placed at different positions on stage 100.

The error detection device 300 is attached to the top surface of stage 100, and is separated from mask 200. In an alternative embodiment, error detection device 300 may have the same size as mask 200 and may be formed on mask 200, as illustrated in FIG. 1B. The error detection device 300 may be detachable from mask 200 in this embodiment.

Figure 3:
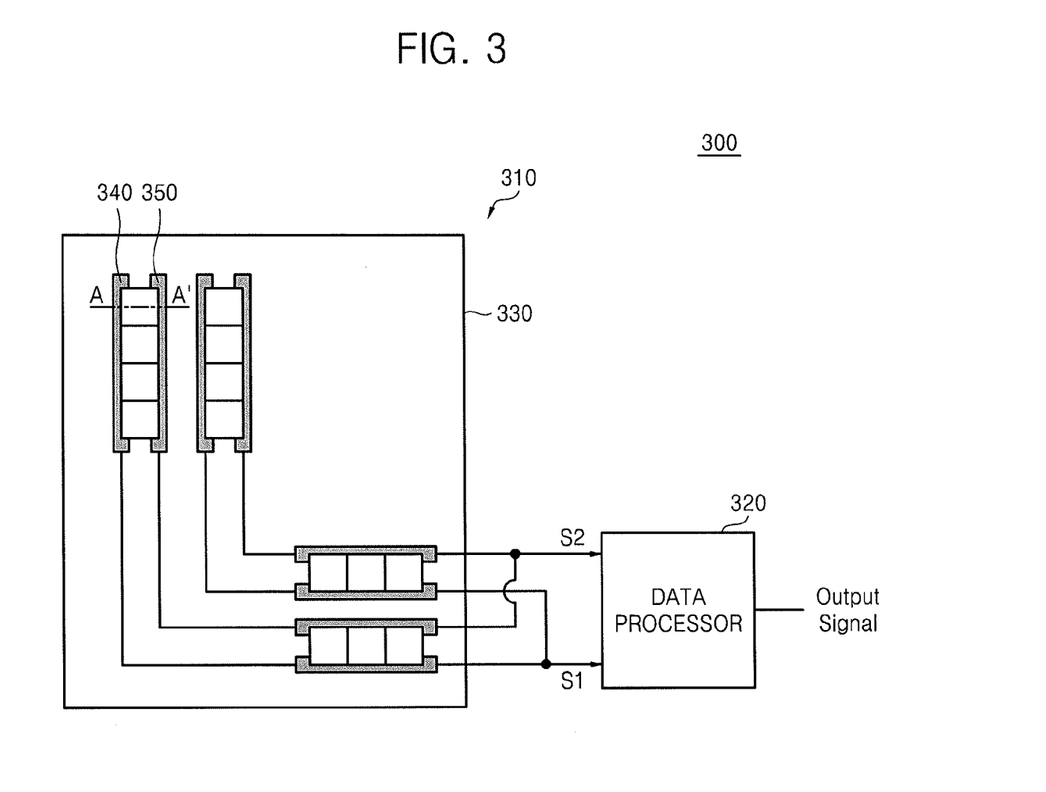
FIG. 3 illustrates an embodiment of an error detection device.

FIG. 3 illustrates an embodiment of error detection device 300 which includes a sensor 310 and a data processor 320. The sensor 310 includes a first line 340 and a second line 350 on a conductor body 330. The sensor 310 may receive electron beams radiated on first line 340 and second line 350 based on input data. At this time, the left and right sides of some of the electron beams may be radiated on first and second lines 340 and 350. Upper and lower sides of other electron beams may be radiated on first and second lines 340 and 350. The sensor 310 may output a signal S1 detected through first line 340 and a signal S2 detected through second line 350 based on an incident electron beam.

Figure 4:
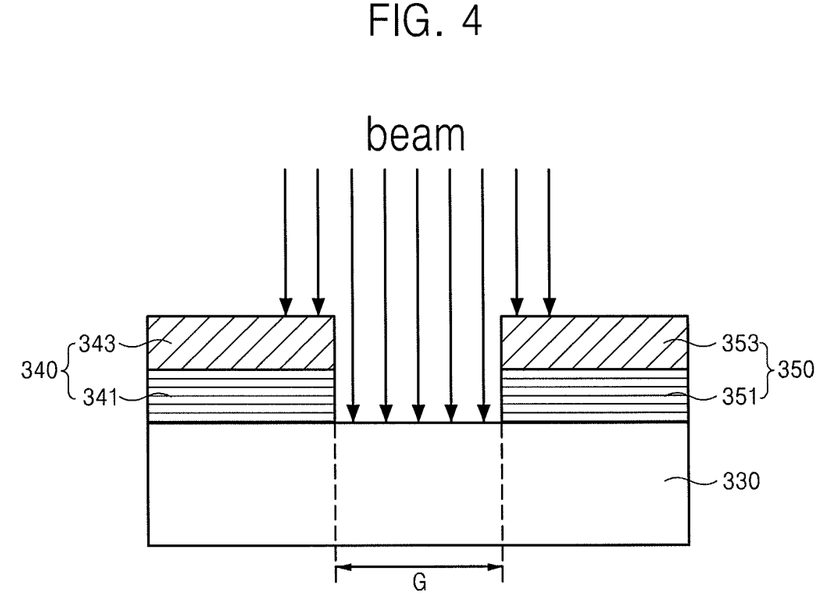
FIG. 4 illustrates an embodiment of a sensor in FIG. 3.

FIG. 4 illustrates an embodiment of sensor 310 taken along section line A-A'. The sensor 310 includes a first nonconductor 341 and a second nonconductor 351 on conductor body 330, which are spaced from each other by a predetermined gap G. The sensor 310 also includes a first conductor 343 and a second conductor 353 on the first nonconductor 341 and the second nonconductor 351, respectively.

The first nonconductor 341 and first conductor 343 at one side of gap G on conductor body 330 may form first line 340. The second nonconductor 351 and second conductor 353 at the other side of gap G may form second line 350. At this time, a beam may be radiated on first and second lines 340 and 350 at a width greater than gap G between the first and second lines 340 and 350.

Referring back to FIG. 3, data processor 320 receives first signal S1 detected through first line 340 and second signal S2 detected through second line 350. The data processor 320 may compare the first signal S1 with the second signal S2 and output error detection information (e.g., an output signal) based on a result of the comparison. The electron beam may have a square or rectangular shape in one embodiment. In other embodiments, the electron beam may have a different shape.

Figure 5:
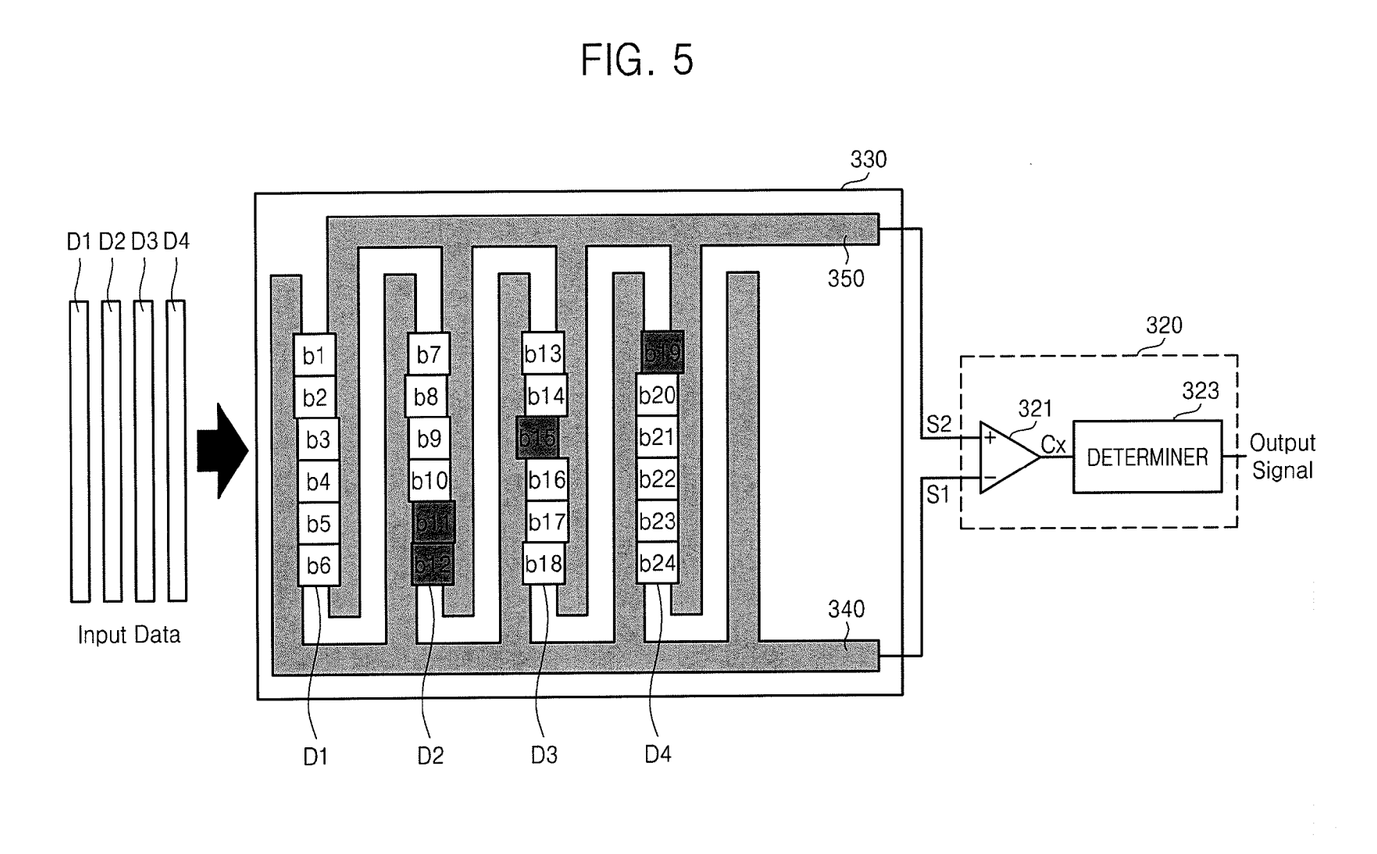
FIG. 5 illustrates another embodiment of an error detection device.
Figure 6:
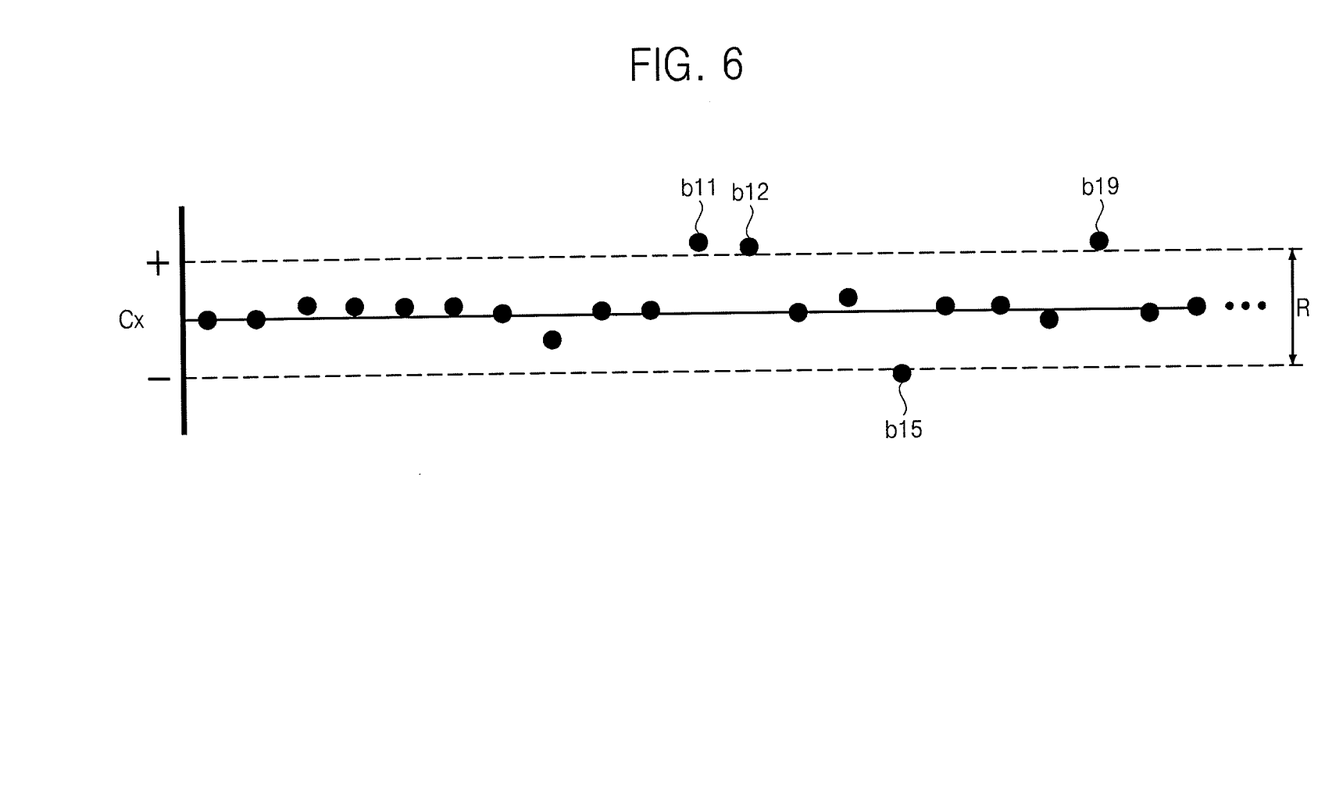
FIG. 6 illustrates operation of the error detection device in FIG. 5.

FIG. 5 illustrates another embodiment of error detection device 300. FIG. 6 explains operation of error detection device 300 in FIG. 5. In order to detect a position error of an electron beam, electron beams corresponding to input data may be radiated on first and second lines 340 and 350 on conductor body 330.

For instance, when the input data includes first through fourth data D1 through D4, first through 24th electron beams b1 through b24 corresponding to data D1 through D4 may be repeatedly radiated by electron gun 20 through electron beam source 30 at predetermined intervals. The first and second lines 340 and 350 detect first and second signals S1 and S2, respectively, with respect to the first through 24th electron beams b1 through b24, and send the first and second signals S1 and S2 to data processor 320.

The data processor 320 compares the first and second signals S1 and S2 with each other and outputs error detection information based on the comparison result. To perform these operations, data processor 320 may include a comparator 321 and a determiner 323.

The comparator 321 compares the first signal S1 detected from first conductor 343 of first line 340 with the second signal S2 detected from second conductor 353 of second line 350, and outputs a difference value Cx between first and second signals S1 and S2. The determiner 323 may determine whether the difference value Cx between the first signal S1 and second signal S2 is within a predetermined first reference range R, and outputs error detection information corresponding to an electron beam with an error based on the determination result.

For instance, as shown in FIG. 6, determiner 323 may determine that an error has occurred in the 11th, 12th, 15th and 19th electron beams b11, b12, b15, and b19 because the difference values Cx between the first signal S1 and second signal S2 for these beams lie outside first reference range R. The determiner 323 may generate an output signal corresponding to the error detection information. The error detection information may include, for example, size information and position information of each electron beam with an error and the number of electron beams with an error. To perform this operation, determiner 323 may include a counter to count the number of electron beams with an error.

Data processor 320 may optionally include a storage unit to store the error detection information of each electron beam output from determiner 323. The error detection information of all electron beams may be output at one time.

Figure 7:
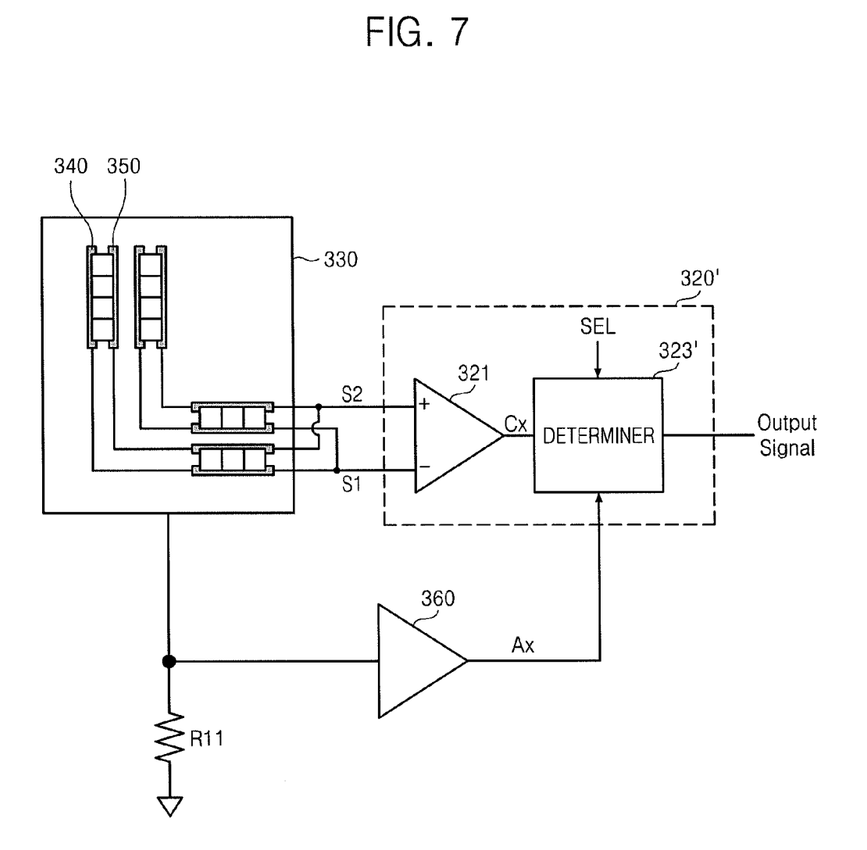
FIG. 7 illustrates another embodiment of an error detection device.

FIG. 7 illustrates another embodiment of error detection device 300. Referring to FIG. 7, error detection device 300 may include a resistor R11 and amplifier 360.

The resistor R11 functions as a ground resistor to prevent an electron beam radiated on conductor body 330 from being reflected. The amplifier 360 may detect the energy of electron beams corresponding to input data based on the amount of current detected from the lower part of conductor body 330. At this time, the energy may be the strength of power of the electron beams irradiated from electron gun 20 on the first and second lines 340 and 350 through electron beam source 30.

A determiner 323' may determine whether a value Ax output from amplifier 360 is within a predetermined second reference range, and may output error detection information (e.g., an output signal corresponding to an electron beam with an error) based on the determination result. The second reference range may be a predetermined range based on a mean or average energy of electron beams.

For instance, when energy detected from an electron beam is outside the second reference range, it may be determined that the electron beam is radiated by the electron beam source 30 with greater or less energy than other electron beams. In other words, the electron beam is determined to have a different size than other electron beams.

The determiner 323' may selectively output error detection information of an electron beam with an error based on difference value Cx between the first signal S1 and second signal S2 or output value Ax of the amplifier 360 in response to a selection signal SEL. For example, when electron beams are radiated on first and second lines 340 and 350, a size error of an electron beam may be detected based on the energy of each of the electron beams.

Figure 8:
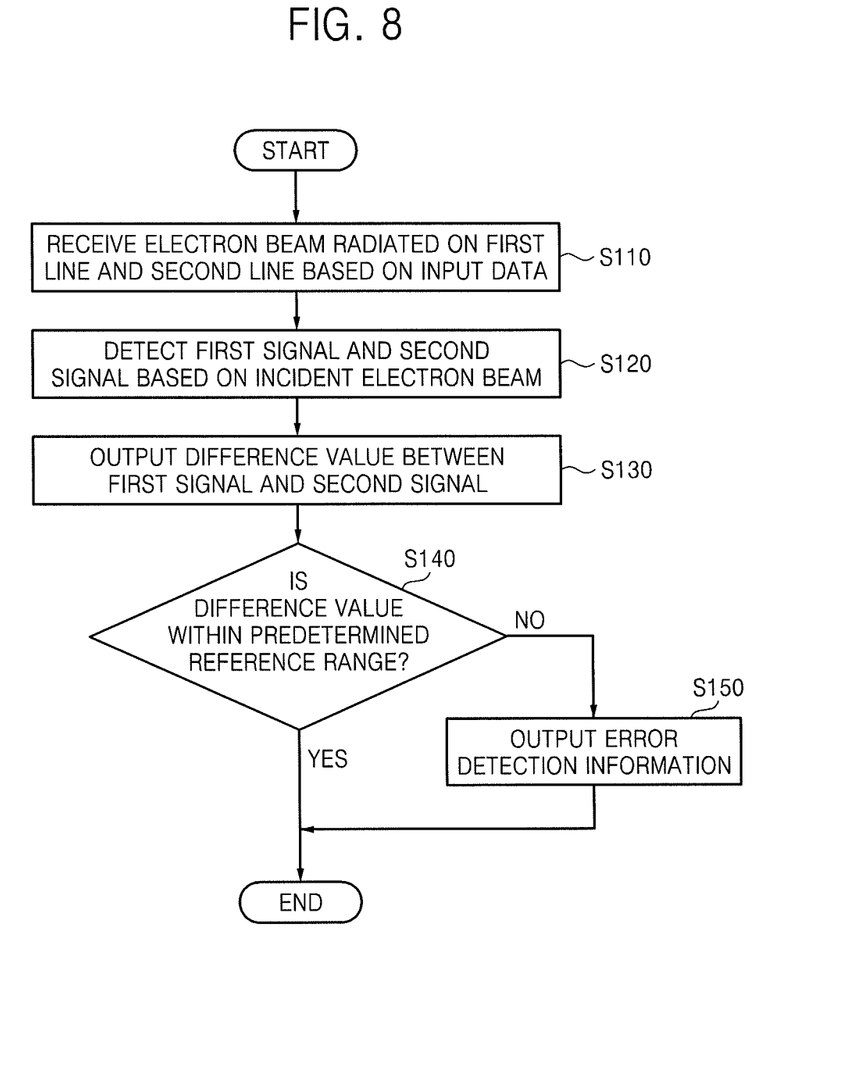
FIG. 8 illustrates an embodiment of an error detection method.

FIG. 8 illustrates an embodiment of a method for detecting error using, for example, electron beam exposure apparatus 10. Referring to FIGS. 1 through 8, sensor 310 receives an electron beam radiated by electron gun 20 on first and second lines 340 and 350 through electron beam source 30 based on input data, in operation S110. At this time, electron beam source 30 may radiate a plurality of electron beams based on the input data. The sensor 310 detects first and second signals S1 and S2 respectively corresponding to first and second lines 340 and 350 based on the incident electron beams, in operation S120.

The data processor 320 outputs a difference value between the first and second signals S1 and S2 based on a result of comparing first and second signals S1 and S2 in operation S130, and determines whether the difference value is within a predetermined reference range, in operation S140.

When the difference value is outside the predetermined reference range, data processor 320 outputs error detection information corresponding to the electron beam, in operation S150. The error detection information may include size and position information of each electron beam with an error and the number of electron beams with an error.

Operations S110 through S140 may be repeatedly performed for each of a plurality of electron beams radiated on sensor 310 based on the input data. Operation S150 may be performed every time error detection on each of the electron beams is completed, or after error detection on every electron beam is completed.

In accordance with another embodiment, a computer-readable medium stores a computer program including programmed code to perform the functions and operations of the aforementioned apparatus and method embodiments. The code may control the electron beam exposure apparatus, stage, error detection device, and/or other features of the aforementioned embodiments to generate error detection information.

In accordance with one or more of the aforementioned embodiments, an electron beam exposure apparatus detects an error of an electron beam in real time just through an exposure. As a result, error detection time and costs may be reduced.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. An electron beam exposure apparatus, comprising:
   an electron beam source to radiate a first electron beam corresponding to first input data and a second electron beam corresponding to second input data;
   a stage including a mask on which the first electron beam is radiated, the stage to move the mask; and
   an error detection device to detect an error of the second electron beam and to output error detection information.

2. The apparatus as claimed in claim 1, wherein the error detection device includes:
   a sensor including a first line and a second line, wherein the sensor is to receive the second electron beam radiated on the first and second lines and to detect a first signal from the first line and a second signal from the second line; and
   a data processor to output the error detection information based on a result of comparing the first signal with the second signal.

3. The apparatus as claimed in claim 2, wherein the sensor includes:
   a first conductor disposed on a first nonconductor that is spaced by a predetermined gap from a second conductor disposed on a second nonconductor, wherein one of the first or second nonconductors and one of the first or second conductors at one side of the predetermined gap form the first line and wherein another one of the first or second nonconductors and another one of the first or second conductors at another side of the predetermined gap form the second line.

4. The apparatus as claimed in claim 3, wherein the second electron beam has a width greater than the predetermined gap.

5. The apparatus as claimed in claim 3, wherein the data processor includes:
   a comparator to compare the first signal with the second signal, and to output a difference value between the first and second signals according to a result of the comparison; and
   a determiner to determine whether the difference value is within a predetermined first reference range, wherein the determiner is to output the error detection information based on a result of the determination.

6. The apparatus as claimed in claim 5, wherein the determiner is to count the number of electron beams with an error based on the determination result.

7. The apparatus as claimed in claim 6, wherein the error detection device further includes:
   an amplifier to detect energy of the second electron beam based on an amount of current detected from a lower part of the first conductor, wherein the determiner is to determine whether the energy is within a predetermined second reference range and outputs error detection information based on a result of the determination based on the second reference range.

8. The apparatus as claimed in claim 7, wherein:
   a plurality of second electron beams are radiated by the electron beam source based on the second input data at predetermined intervals,
   left and right sides of second electron beams in a first group are radiated on the first and second lines, and
   upper and lower sides of second electron beams in a second group are radiated on the first and second lines.

9. The apparatus as claimed in claim 8, wherein the error detection information includes beam size information, beam position information, and a number of electron beams with an error.

10. The apparatus as claimed in claim 1, wherein the error detection device is attached to the stage on which the mask is formed, separated from the mask, or is detachably formed on a top of the mask in a same size as the mask.

* * * * *